United States Patent
Lee et al.

(10) Patent No.: US 8,361,561 B2
(45) Date of Patent: Jan. 29, 2013

(54) METHOD OF MANUFACTURING SILICON FILM BY USING SILICON SOLUTION PROCESS

(75) Inventors: Jung-hyun Lee, Suwon-si (KR); Dong-joon Ma, Anyang-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 314 days.

(21) Appl. No.: 12/659,329

(22) Filed: Mar. 4, 2010

(65) Prior Publication Data

US 2010/0304043 A1    Dec. 2, 2010

(30) Foreign Application Priority Data

Jun. 2, 2009    (KR) .................. 10-2009-0048652

(51) Int. Cl.
*B05D 3/06*    (2006.01)

(52) U.S. Cl. ........ 427/493; 427/496; 427/498; 427/503; 427/504; 427/508; 427/510; 427/512; 427/515; 427/532; 427/551; 427/552; 427/553; 427/561; 427/568; 427/376.2; 427/387; 427/240; 427/421.1

(58) Field of Classification Search .................. None
See application file for complete search history.

(56) References Cited

U.S. PATENT DOCUMENTS

| 5,594,042 | A | 1/1997 | Glover et al. |
| 6,514,801 | B1 | 2/2003 | Yudasaka et al. |
| 6,517,911 | B1 | 2/2003 | Matsuki |
| 6,541,354 | B1 | 4/2003 | Shimoda et al. |
| 7,314,513 | B1 * | 1/2008 | Zurcher et al. ........... 106/287.14 |
| 2002/0034585 | A1 | 3/2002 | Matsuki et al. |

FOREIGN PATENT DOCUMENTS

| JP | 01-246816 | 10/1989 |
| JP | 2001-332497 | 11/2001 |
| KR | 94-26051 | 12/1994 |

\* cited by examiner

*Primary Examiner* — Erma Cameron
(74) *Attorney, Agent, or Firm* — Harness, Dickey & Pierce, P.L.C.

(57) ABSTRACT

Provided may be a method of manufacturing a silicon (Si) film by using a Si solution process. According to the method of manufacturing the Si film, the Si film may be manufactured by preparing a Si forming solution. The ultraviolet rays (UV) may be irradiated on the prepared Si forming solution. The Si forming solution may be coated on a substrate and a solvent in the Si forming solution may be coated on the substrate. An electron beam may be irradiated on the Si forming solution from which the solvent is removed.

7 Claims, 2 Drawing Sheets

METHOD OF MANUFACTURING SILICON FILM BY USING SILICON SOLUTION PROCESS

CROSS-REFERENCE TO RELATED APPLICATION

This application claims priority under 35 USC §119 to Korean Patent Application No. 10-2009-0048652, filed on Jun. 2, 2009, in the Korean Intellectual Property Office (KIPO), the entire contents of which are incorporated herein by reference.

BACKGROUND

1. Field

Example embodiments relate to a method of manufacturing a silicon (Si) film, and more particularly, to a method of manufacturing a Si film by using a Si solution process instead of a poly Si wafer process.

2. Description of the Related Art

Thermal chemical vapor deposition (CVD) or plasma enhanced CVD may be used to form silicon (Si) thin films, for example, amorphous Si thin films or poly Si thin films. The thermal CVD or plasma enhanced CVD may be performed using silane gas or disilane gas.

When a Si thin film is formed using CVD, obtaining a uniform film may be difficult. Also, the formation of a Si thin film may be a time-consuming process, thereby adversely affecting yield. In addition, the manufacturing process may be complicated, and thus, an expensive vacuum device and a high frequency generator may be needed. Moreover, silane, which may be a highly reactive gas, may be difficult to handle.

In order to overcome such problems in the formation of Si thin films by using a vacuum device, a method of coating liquid type silane on a substrate has been introduced. However, a complicated device for gasifying and cooling silane may be needed and the thickness of formed Si thin films may be difficult to control.

SUMMARY

Example embodiments include a method of manufacturing a silicon (Si) film at a lower temperature. Example embodiments include a method of manufacturing a Si film whereby the thickness of the Si film may be controlled. Additional aspects will be set forth in part in the description which follows and, in part, will be apparent from the description, or may be learned by practice of example embodiments.

According to example embodiments, a method of manufacturing a silicon (Si) film by using a Si solution process may include preparing a Si forming solution; irradiating ultraviolet rays (UV) on the prepared Si forming solution; coating the Si forming solution on a substrate; removing a solvent in the Si forming solution coated on the substrate; and irradiating an electron beam on the Si forming solution from which the solvent may be removed.

The Si forming solution may be prepared by dissolving cyclohexasilane in the solvent. The solvent may include at least one selected from the group consisting of a hydrocarbon-based solvent, an ether-based solvent, and an aprotic polar solvent. The solvent may include decane. The solvent in the Si forming solution may be removed at a temperature of about 80 to about 150° C. The Si forming solution may be coated on the substrate by sol-gel coating, spin coating, spray coating or an inkjet method. The electron beam may be irradiated on the Si forming solution at room temperature.

BRIEF DESCRIPTION OF THE DRAWINGS

Example embodiments will be more clearly understood from the following detailed description taken in conjunction with the accompanying drawings.

FIG. 1 is a flowchart illustrating a method of manufacturing a silicon (Si) film by using a Si solution process, according to example embodiments;

FIG. 2 illustrates a chemical structure of cyclohexasilane according to example embodiments; and FIG. 3 is a graph showing results of measuring the degree of crystallinity of a Si film by using a Raman spectroscopy.

Figure 1:
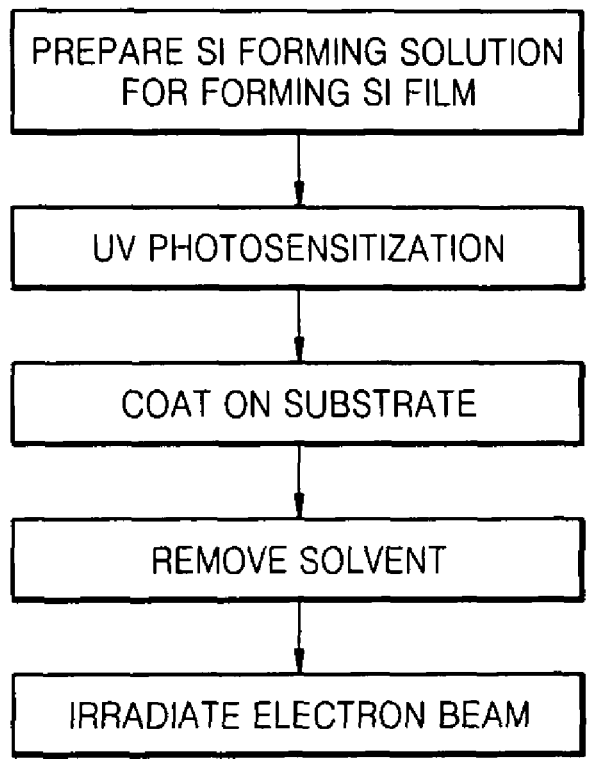
FIGS. 1-3 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION

Hereinafter, a method of manufacturing a silicon (Si) film by using a Si solution process according to example embodiments will be described in more detail. In the drawings, the thicknesses of layers and regions may be exaggerated for clarity.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 2:
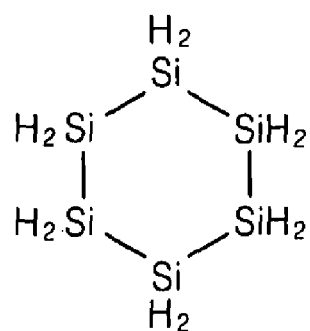

FIG. 1 is a flowchart illustrating a method of manufacturing a silicon (Si) film by using a Si solution process, according to example embodiments. Referring to FIG. 1, a Si forming solution for forming a Si film may be prepared. The Si forming solution may be prepared by dissolving cyclohexasilane in a solvent. FIG. 2 illustrates a chemical structure of cyclohexasilane.

The solvent for dissolving cyclohexasilane may not be limited, as long as cyclohexasilane may be dissolved in the solvent. For example, the solvent may include at least one selected from the group consisting of a hydrocarbon-based solvent, e.g., decane, toluene, xylene, or cyclohexyl benzene, an ether-based solvent, e.g., ethylene glycol dimethyl ether, ethylene glycol diethyl ether, or ethylene glycol methylethyl ether, and an aprotic polar solvent, e.g., dimethylformamide or cyclohexanone.

Ultraviolet rays (UV) may be irradiated to the prepared Si forming solution so as to photosensitize the Si forming solution, thereby polymerizing some part of the Si forming solution. The UV rays may be irradiated using an excimer laser, mercury lamp, argon laser and/or carbon dioxide laser.

The Si forming solution may be coated on a substrate. The type, form, and material of the substrate may not be particularly restricted. For example, the substrate may be formed of a semiconductor material, glass, a metal, polyimide, or plastic, e.g., polyether sulfone. The method of coating the substrate may not be particularly restricted; however, sol-gel coating, spin coating, spray coating or an inkjet method may be used.

The frequency of coating the Si forming solution may not be particularly restricted and the Si solution may be coated on the substrate one or more times in order to form a Si film. The thickness of the Si film on the substrate may not be particularly restricted and may be adjusted according to the use thereof. For example, when the Si forming solution is used to form a solar cell, the thickness of the Si film may be 10 microns or greater.

The solvent in the Si forming solution coated on the substrate may be removed. For example, when a hydrocarbon-based solvent, e.g., decane, is used as the solvent, the solvent may be removed at a temperature of about 80 to about 150° C. Because the solvent in the Si forming solution coated on the substrate is removed by volatilization, cyclohexasilane may remain on the substrate.

In the method of manufacturing a Si film by using a Si solution process according to example embodiments, the cyclohexasilane may be dissolved in, for example, a hydrocarbon-based solvent. The hydrocarbon-based solvent may have a lower boiling point than that of cyclohexasilane and a higher coefficient of viscosity than that of cyclohexasilane so that the quality of a Si film may be improved.

An electron beam may be irradiated to the cyclohexasilane remaining on the substrate. The electron beam may be irradiated at room temperature. When an electron beam is irradiated to the cyclohexasilane from which the solvent may be removed, hydrogen in the cyclohexasilane remaining on the substrate may be removed and crystallization of the Si film may be induced. Alternatively, instead of irradiating an electron beam, a separate high-temperature heating process for removing hydrogen in the cyclohexasilane may be performed.

When a heat treatment process is performed for removing hydrogen in the cyclohexasilane, a temperature of about 450° C. or above may be needed due to a higher energy state as a result of a Si—H combination. Accordingly, the substrate may not be formed of a material having properties that vary at higher temperatures. Therefore, the material of the substrate may be limited. Thus, when a process of removing hydrogen in the cyclohexasilane is performed by using an electron beam, such a process may be performed at room temperature so that the substrate may be formed of various types of materials and a Si film may be crystallized due to irradiation of the electron beam.

Figure 3:
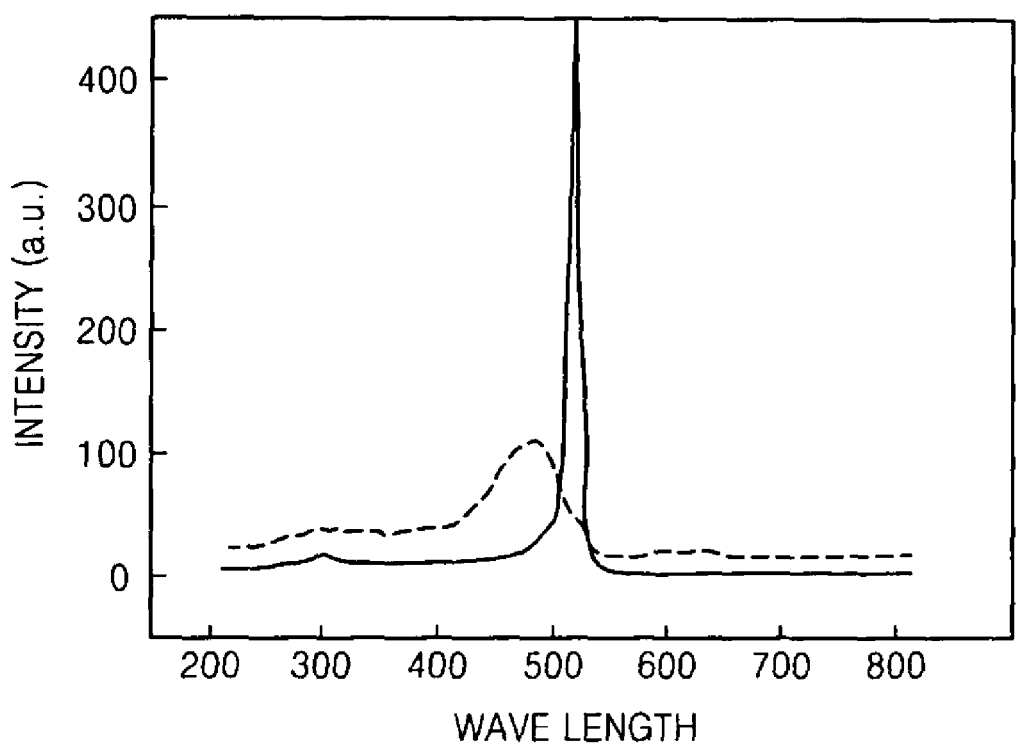

In order to analyze the crystallization of the Si film manufactured as above, the degree of crystallinity of the Si film may be measured by using a Raman spectroscopy and the results are shown in FIG. 3.

An example of a Si film may be prepared as follows. Cyclohexasilane is dissolved in a decane solvent, thereby preparing a 30 mol % Si forming solution for forming a Si film. UV rays are irradiated to the prepared Si solution. The Si forming solution is coated on a glass substrate to a thickness of about 10 microns or greater by using sol-gel coating. In order to remove the decane solvent, the decane solvent may be removed at a temperature of about 100° C. Finally, while the decane solvent is removed, an electron beam may be irradiated to the cyclohexasilane remaining on the glass substrate at room temperature. The degree of crystallinity may be measured for the sample by using Raman spectroscopy.

Referring to FIG. 3, the dotted line indicates amorphous Si and the solid line indicates crystallized Si. A peak of the crystallized Si occurs at a specific wavelength. Consequently, the cyclohexasilane may be crystallized due to irradiation of the electron beam at room temperature and a Si film may be manufactured without a high-temperature process.

In the method of manufacturing a Si film according to example embodiments, the Si film may be manufactured by using a low-temperature process so that various types of substrates may be used and the thickness of the Si film may be controlled according to the use thereof. Thus, the method of manufacturing a Si film which is used in various ways may be provided.

It should be understood that example embodiments described therein should be considered in a descriptive sense only and not for purposes of limitation. Descriptions of features or aspects within each example embodiment should typically be considered as available for other similar features or aspects in other example embodiments.

What is claimed is:

1. A method of manufacturing a silicon (Si) film by using a Si solution process, the method consisting essentially of:
   preparing a Si forming solution;
   irradiating ultraviolet rays (UV) on the prepared Si forming solution;
   after the irradiating, coating the Si forming solution on a substrate;
   removing a solvent in the Si forming solution coated on the substrate; and
   irradiating an electron beam on remaining materials of the Si forming solution from which the solvent is removed.

2. The method of claim 1, wherein the Si forming solution is prepared by dissolving cyclohexasilane in the solvent.

3. The method of claim 2, wherein the solvent includes at least one selected from the group consisting of a hydrocarbon-based solvent, an ether-based solvent, and an aprotic polar solvent.

4. The method of claim 3, wherein the solvent includes decane.

5. The method of claim 4, wherein the solvent in the Si forming solution is removed at a temperature of about 80 to about 150° C.

6. The method of claim 1, wherein the Si forming solution is coated on the substrate by sol-gel coating, spin coating, spray coating or an inkjet method.

7. The method of claim 1, wherein the electron beam is irradiated on remaining materials of the Si forming solution from which the solvent is removed at room temperature.

* * * * *